(12) United States Patent
Nishihara et al.

(10) Patent No.: US 12,532,442 B2
(45) Date of Patent: Jan. 20, 2026

(54) ELECTROMAGNETIC INTERFERENCE SUPPRESSING MATERIAL

(71) Applicants: KYOCERA Corporation, Kyoto (JP); Tohoku University, Sendai (JP)

(72) Inventors: Hirotomo Nishihara, Sendai (JP); Shigeyoshi Yoshida, Sendai (JP); Ken Uchida, Tokyo (JP)

(73) Assignee: KYOCERA CORPORATION, Kyoto (JP)

( * ) Notice: Subject to any disclaimer, the term of this patent is extended or adjusted under 35 U.S.C. 154(b) by 1 day.

(21) Appl. No.: 18/714,401

(22) PCT Filed: Nov. 30, 2022

(86) PCT No.: PCT/JP2022/044122
§ 371 (c)(1),
(2) Date: May 29, 2024

(87) PCT Pub. No.: WO2023/100923
PCT Pub. Date: Jun. 8, 2023

(65) Prior Publication Data
US 2025/0031355 A1    Jan. 23, 2025

(30) Foreign Application Priority Data
Dec. 1, 2021  (JP) .................. 2021-195681

(51) Int. Cl.
*H05K 9/00*    (2006.01)

(52) U.S. Cl.
CPC .................. *H05K 9/0083* (2013.01)

(58) Field of Classification Search
CPC .................................. H05K 9/0083
See application file for complete search history.

(56) References Cited

U.S. PATENT DOCUMENTS

| | | |
|---|---|---|
| 4,952,935 A | 8/1990 | Sawa et al. |
| 2004/0108486 A1* | 6/2004 | Yoshida ............... H05K 1/0233 |
| | | 257/E23.114 |
| 2005/0030218 A1 | 2/2005 | Kondo et al. |
| 2012/0038532 A1* | 2/2012 | Yonetsu ................. H01Q 17/00 |
| | | 427/127 |
| 2016/0007510 A1* | 1/2016 | Cheng .................. H05K 9/0088 |
| | | 428/335 |

FOREIGN PATENT DOCUMENTS

| | | |
|---|---|---|
| JP | 2-28399 | 1/1990 |
| JP | 2000-294978 A | 10/2000 |
| JP | 2001-068889 A | 3/2001 |
| JP | 2004-043705 A | 2/2004 |
| JP | 2005-057093 A | 3/2005 |
| JP | 2008-001757 A | 1/2008 |
| JP | 2012-209515 A | 10/2012 |
| JP | 2021-084819 A | 6/2021 |
| WO | 2021/166343 A1 | 8/2021 |

* cited by examiner

*Primary Examiner* — Hung V Ngo
(74) *Attorney, Agent, or Firm* — Volpe Koenig

(57) ABSTRACT

An electromagnetic interference suppressing material includes: a base material containing at least one selected from the group consisting of an organic substance and an inorganic substance; and a powder carbon material. The powder carbon material includes at least one selected from the group consisting of a first shell-shaped body and a second shell-shaped body, where the first shell-shaped body is a hollow particle having one pore or two or more pores, and the second shell-shaped body has a shape in which hollow particles are connected and has a plurality of pores, and a shell portion of the first shell-shaped body and the second shell-shaped body is made of graphene having an average number of layers of 4 or less.

11 Claims, No Drawings

ELECTROMAGNETIC INTERFERENCE SUPPRESSING MATERIAL

TECHNICAL FIELD

The present disclosure relates to an electromagnetic interference suppressing material.

BACKGROUND OF INVENTION

In recent years, various measures have been taken for the purpose of reducing electromagnetic failure including malfunction of a device due to electromagnetic noises, information leakage, and reduction in information communication speed due to interference. As a means for reducing electromagnetic failure, a method for blocking electromagnetic waves by reflection, or a method for absorbing electromagnetic waves has been proposed.

For example, Patent Document 1 proposes an electromagnetic wave shielding material obtained by dispersing soft magnetic metallic powder such as powder of a metal selected from Fe, Ni, Co and V or an alloy of two or more of these metals in a rubber or plastic matrix. Patent Document 2 proposes a sheet-shaped radio wave absorber obtained by layering, on a surface of a metal body, a radio wave absorbing layer made of a radio wave absorbing material obtained by dispersing silicon-carbide powder in a matrix resin. Patent Document 3 proposes an electromagnetic wave absorbing sheet in a frequency band of from 5 to 7 GHz, having a dielectric layer made of a matrix containing a carbon material, a divided conductive film layer layered on one side of the dielectric layer, and an electromagnetic wave reflecting layer layered on the other side of the dielectric layer.

CITATION LIST

Patent Literature

Patent Document 1: JP 2001-68889 A
Patent Document 2: JP 2005-57093 A
Patent Document 3: JP 2012-209515 A

SUMMARY

Problem to be Solved

Many proposals have been made for the purpose of reducing electromagnetic failure, such as the electromagnetic wave shielding material, the radio wave absorber, and the electromagnetic wave absorbing sheet described in Patent Documents 1 to 3. However, with recent improvement in performance and diversification of communication devices, electromagnetic failure may not be sufficiently reduced, and further improvement has been required.

In addition, the method for blocking electromagnetic waves by reflection using a metal or the like has an issue of inevitably involving autointoxication.

The present disclosure has been made in view of such circumstances, and an object thereof is to provide an electromagnetic interference suppressing material having good electromagnetic wave absorption performance and electromagnetic interference suppression performance, and having better electromagnetic failure reduction performance.

Solution to Problem

As a result of intensive studies to solve the above-described issues, the present inventors have found that an electromagnetic interference suppressing material including a base material containing an organic substance and/or an inorganic substance and a predetermined powder carbon material has good electromagnetic wave absorption performance and electromagnetic interference suppression performance, and further has better electromagnetic failure reduction performance. The present disclosure has been completed based on such a finding.

That is, the present disclosure relates to the following.

[1] An electromagnetic interference suppressing material including: a base material containing at least one selected from the group consisting of an organic substance and an inorganic substance; and a powder carbon material, in which the powder carbon material contains at least one selected from the group consisting of a first shell-shaped body and a second shell-shaped body, the first shell-shaped body being a hollow particle having one pore, and the second shell-shaped body having a shape in which hollow particles are connected and having a plurality of pores, and a shell portion of the first shell-shaped body and the second shell-shaped body includes graphene having an average number of layers of 4 or less.

[2] The electromagnetic interference suppressing material according to [1], in which a specific surface area of the powder carbon material is 1300 $m^2/g$ or more.

[3] The electromagnetic interference suppressing material according to [1] or [2], in which a volume of the pore possessed by the first shell-shaped body and a volume of the pores possessed by the second shell-shaped body are 1.3 cc/g or more.

[4] The electromagnetic interference suppressing material according to any of the above [1] to [3], in which a volume resistance is $10^3$ Ω·cm or more.

[5] The electromagnetic interference suppressing material according to any of [1] to [4], in which an average particle diameter of the powder carbon material is 200 μm or less.

[6] The electromagnetic interference suppressing material according to any of [1] to [5], in which the organic substance is an epoxy resin.

[7] The electromagnetic interference suppressing material according to any of [1] to [5], in which the inorganic substance is a ceramic.

[8] The electromagnetic interference suppressing material according to any of [1] to [7], in which the organic substance or the inorganic substance is a foam.

[9] The electromagnetic interference suppressing material according to any of [1] to [8], in which a content of the powder carbon material is from 0.01 to 95 mass %.

[10] The electromagnetic interference suppressing material according to any of [1] to [9], in which the powder carbon material is present on a surface of a base material, the base material containing at least one selected from the group consisting of the organic substance and the inorganic substance.

[11] A semiconductor element sealing material, including the electromagnetic interference suppressing material according to any of [1] to [7].

Advantageous Effect

The present disclosure can provide an electromagnetic interference suppressing material having good electromagnetic wave absorption performance and electromagnetic interference suppression performance, and having better electromagnetic failure reduction performance.

DESCRIPTION OF EMBODIMENTS

Hereinafter, the present disclosure will be described in detail with reference to an embodiment.

In the present description, wording of "from XX to YY" refers to "XX or greater and YY or less".

In the present description, with regard to numerical ranges (e.g., ranges such as content), lower and upper limit values described in a stepwise manner may each be independently combined. In a numerical range described herein, the upper or lower limit value of the numerical range may be replaced by a value presented in the examples.

In the present specification, the term "electromagnetic interference suppressing material" refers to a material capable of attenuating a near electromagnetic field and electromagnetic waves by using loss properties (magnetic loss, dielectric loss, electric resistance, and the like).

Note that in the present specification, the term "graphene" means a "sheet-shaped substance of $sp^2$-bonded carbon atoms having 10 or fewer layers".

In the present specification, the "average number of layers" of graphene is a value obtained by the following formula. Specifically, it is obtained by a method which will be described in the Examples below.

$$\text{Average number of layers of graphene} = 2627 \ (m^2/g) / \text{specific surface area} \ (m^2/g)$$

The specific surface area refers to a BET specific surface area, and is a value obtained by measurement by a BET multipoint method by nitrogen adsorption.

In the present specification, the hollow particle refers to a particle having a shell portion and is hollow inside surrounded by the shell portion.

[Electromagnetic Interference Suppressing Material]

An electromagnetic interference suppressing material according to the present disclosure includes a base material including an organic substance and/or an inorganic substance, and a powder carbon material. The powder carbon material includes a first shell-shaped body and/or a second shell-shaped body, the shell-shaped body being a hollow particle having one pore, the second shell-shaped body having a shape in which hollow particles are connected and having a plurality of pores, and shell portions of the first shell-shaped body and the second shell-shaped body are made of graphene having an average number of layers of 4 or less.

When the powder carbon material includes the first shell-shaped body and/or the second shell-shaped body, and shell portions of the first shell-shaped body and the second shell-shaped body are made of graphene having an average number of layers of 4 or less, the obtained electromagnetic interference suppressing material has good electromagnetic wave absorption performance and electromagnetic interference suppression performance, and has better electromagnetic failure reduction performance. The reason why such an electromagnetic interference suppressing material is obtained is not clear, but is considered as follows.

The powder carbon material of the present disclosure is a hollow particle, and a shell portion of the hollow particle is made of graphene having an average number of layers of 4 or less. In other words, the powder carbon material of the present disclosure is a shell-shaped graphene laminate body composed of graphene sheets each having an average number of three dimensionally continuous layers of 4 or less. Therefore, the powder carbon material has a large specific surface area and a high radio wave absorption performance per unit area. Further, the powder carbon material can improve the volume resistance, as compared with a case where the same amount of different carbon material is contained. With the large specific surface area and the volume resistance improvement effect, it is considered that blending the powder carbon material of the present disclosure enhances the electromagnetic wave absorption performance and the electromagnetic interference suppression performance.

The shell portions of the first shell-shaped body and the second shell-shaped body may be made of graphene having an average number of layers of less than 4, 3 or less, 2.5 or less, 2.0 or less, or 1.9 or less, from the viewpoint of increasing the specific surface area of the powder carbon material and further improving the electromagnetic wave absorption performance and the electromagnetic interference suppression performance.

In an aspect of the present disclosure, the electromagnetic interference suppressing material may have a volume resistance of $10^3$ Ω·cm or more, $10^6$ Ω·cm or more, or $10^7$ Ω·cm or more from the viewpoint of further improving the electromagnetic wave absorption performance and the electromagnetic interference suppression performance. The upper limit is not particularly set, but may be $10^{16}$ Ω·cm or less.

The powder carbon material of the present disclosure may be present in the electromagnetic interference suppressing material, or may be present on a surface of the base material containing the organic substance and/or the inorganic substance.

<Powder Carbon Material>

The powder carbon material of the present disclosure is a first shell-shaped body and/or a second shell-shaped body, the first shell-shaped body being a hollow particle having one pore, and the second shell-shaped body having a shape in which hollow particles are connected and having a plurality of pores. Shell portions of the first shell-shaped body and the second shell-shaped body are made of graphene having an average number of layers of 4 or less.

The first shell-shaped body of the present disclosure is a hollow particle having one pore. An average pore diameter of the pores of the first shell-shaped bodies may be from 0.5 to 100 nm, from 0.7 to 50 nm, or from 1.0 to 20 nm.

The average pore diameters of the pores of the first shell-shaped bodies and the pores of the second shell-shaped bodies are values obtained by the following formula on the assumption that the pores are cylindrical pores.

$$\text{Average pore diameter of pores} = 4 \times \text{pore volume} / \text{specific surface area} \ (m^2/g)$$

The pore volume is a value per material mass obtained from an adsorption amount at a relative pressure (P/PO) of 0.96 by performing nitrogen adsorption isotherm measurement, and the specific surface area is a BET specific surface area and is a value obtained by measurement by a BET multipoint method using nitrogen adsorption.

The second shell-shaped body of the present disclosure has a shape in which hollow particles are connected to each other and has a plurality of pores.

The second shell-shaped body has only to have a plurality of pores, and is not particularly limited. The average pore diameter for one pore of the second shell-shaped body may be from 0.5 to 100 nm, from 0.7 to 50 nm, or from 1.0 to 20 nm.

An average particle diameter of the first shell-shaped body may be considered to be the same as the average pore diameter for the pore of the first shell-shaped body because its shell thickness is very thin.

An average particle diameter of the second shell-shaped body may be 1.0 nm or more, 2.0 nm or more, or 5.0 nm or more from the viewpoint of ease of production, and may be 1000 nm or less, 500 nm or less, or 200 nm or less from the viewpoint of further improving the electromagnetic wave absorption performance and the electromagnetic interference suppression performance.

The average particle diameter of the second shell-shaped body can be estimated by using a laser diffraction-size particle size distribution meter.

An average particle diameter of the powder carbon material may be 200 m or less from the viewpoint of further improving the electromagnetic wave absorption performance and the electromagnetic interference suppression performance. In the present specification, the "average particle diameter of the powder carbon material" refers to an average particle diameter of primary particles when the powder carbon materials are not aggregated and are primary particles, and refers to an average particle diameter of secondary particles when the powder carbon materials are aggregated and form secondary particles.

The average particle diameter of the powder carbon material is a value calculated from the pore volume and the specific surface area, estimated with a laser diffraction-type particle size distribution meter, or calculated as a mean value of the particle diameters of particles observed in from 20 to 100 fields of view using an observation means such as a scanning electron microscope (SEM) or a transmission electron microscope (TEM). The term "particle diameter" refers to the maximum distance among distances between any two points on the contour of a particle, which pass through the center of the particle.

In a case where the powder carbon materials are not aggregated and are primary particles, the average particle diameter (primary particles) of the powder carbon materials may be 1 nm or more, 5 nm or more, or 10 nm or more from the viewpoint of ease of production, and may be 1000 nm or less, 500 nm or less, or 100 nm or less from the viewpoint of further improving the electromagnetic wave absorption performance and the electromagnetic interference suppression performance.

When the powder carbon materials are aggregated and form secondary particles, the average particle diameter (secondary particles) of the powder carbon materials may be 0.1 m or more, 1.0 m or more, or 5.0 m or more from the viewpoint of ease of production, and may be 200 m or less, 100 m or less, 50 m or less, or 20 m or less from the viewpoint of further improving the electromagnetic wave absorption performance and the electromagnetic interference suppression performance.

The specific surface area of the powder carbon material may be 657 $m^2/g$ or more, 1000 $m^2/g$ or more, 1300 $m^2/g$ or more, 1500 $m^2/g$ or more, or 1700 $m^2/g$ or more from the viewpoint of further improving the electromagnetic wave absorption performance and the electromagnetic interference suppression performance. From the viewpoint of ease of production, the specific surface area may be 2627 $m^2/g$ or less, 2500 $m^2/g$ or less, 2400 $m^2/g$ or less, or 2300 $m^2/g$ or less. The specific surface area refers to a BET specific surface area, and is a value measured by a BET multipoint method by nitrogen adsorption.

The volume of the pore of the first shell-shaped body and the volume of the pores of the second shell-shaped body may be 1.0 cc/g or more, 1.3 cc/g or more, 1.6 cc/g or more, 10.0 cc/g or less, 9.0 cc/g or less, or 8.0 cc/g or less from the viewpoint of further improving the electromagnetic wave absorption performance and the electromagnetic interference suppression performance. When the pore volume is 1.0 cc/g or more, a higher specific surface area can be obtained.

The pore volume is a value obtained from an adsorption amount at a relative pressure (P/PO) of 0.96 by performing nitrogen adsorption isotherm measurement.

The powder carbon material of the present disclosure contains carbon as a main component. Here, the phrase "contain carbon as a main component" means that a carbon content of the powder carbon material is 50 mass % or more. The content of carbon in the powder carbon material may be 80 mass % or more, 95 mass % or more, or 98 mass % or more.

In the present disclosure, the content (mass %) of the powder carbon material in the electromagnetic interference suppressing material is not particularly limited because it greatly varies depending on the application and the base material. From the viewpoint of further improving the electromagnetic wave absorption performance and the electromagnetic interference suppression performance, the content may be from 0.01 to 95 mass % with respect to a total amount of the electromagnetic interference suppressing material.

When the electromagnetic interference suppressing material of the present disclosure is a molded body, the content (mass %) of the powder carbon material in the electromagnetic interference suppressing material may be from 0.01 to 95 mass %, from 0.01 to 20 mass %, or from 0.05 to 10 mass % with respect to the total amount of the electromagnetic interference suppressing material from the viewpoint of further improving the electromagnetic wave absorption performance and the electromagnetic interference suppression performance. The molded body refers to a mold produced by placing a product in a mold such as a template or a metal mold.

When the electromagnetic interference suppressing material of the present disclosure is a foam, the content (mass %) of the powder carbon material in the electromagnetic interference suppressing material may be from 0.05 to 20 mass %, from 0.1 to 10 mass %, or from 0.2 to 5 mass % with respect to the total amount of the electromagnetic interference suppressing material from the viewpoint of further improving the electromagnetic wave absorption performance and the electromagnetic interference suppression performance.

[Graphene]

The graphene of the present disclosure is a sheet-shaped substance having a hexagonal lattice structure in which carbon atoms are bonded. Graphene may be in a single-layer state having a layer thickness corresponding to one carbon atom, or in a multi-layer state having two or more layers. Graphene may contain an oxygen atom, a hydrogen atom, a nitrogen atom, a boron atom, or the like in addition to the carbon atom.

A graphene content in the first shell-shaped body and the second shell-shaped body is not particularly limited, but may be 90% mass % or more, 95 mass % or more, or 98 mass % or more from the viewpoint of further improving the electromagnetic wave absorption performance and the electromagnetic interference suppression performance.

<Base Material>

The base material of the present disclosure contains an organic substance and/or an inorganic substance. The base material may contain only an organic substance, only an inorganic substance, or both an organic substance and an inorganic substance.

[Organic Substance]

The organic substance contained in the base material is not particularly limited, and examples thereof include a thermosetting resin and a thermoplastic resin.

Examples of the thermosetting resins include epoxy resins, phenolic resins, and imide resins. Examples of the thermoplastic resins include polyamide resins and polycarbonates.

As an aspect of the present disclosure, the organic substance may be a molded body from the viewpoint of reducing moisture permeability. As another aspect, the organic substance may be a foam from the viewpoint of improving the electromagnetic absorption capacity due to increase in surface area and reduction in weight. Examples of the foam include foamed polyurethane, foamed polystyrene, foamed polyvinyl chloride, foamed polyethylene, foamed polypropylene, and foamed polyethylene terephthalate. Foamed polyurethane may be used from the viewpoint of improving the electromagnetic absorption capacity due to increase in surface area and reduction in weight.

The organic substance may be a thermosetting resin from the viewpoint of the reliability of the molded body using the electromagnetic interference suppressing material, and may be an epoxy resin or an imide resin from the viewpoint of electrical insulation property and heat resistance of the molded body using the electromagnetic interference suppressing material. From the viewpoint of ease of production, durability, weather resistance, or the like, polyurethane may be used. In the case of outdoor use, polycarbonate-based polyurethane having good hydrolysis resistance may be used.

One type of the organic substance may be used, or two or more types may be used in combination.

In the present disclosure, the epoxy resin used as the organic substance has two or more epoxy groups per molecule, and the molecular structure, molecular weight, and the like are not particularly limited, as long as the epoxy resin is one that is commonly used in electronic components.

Examples of the epoxy resin include aliphatic epoxy resins, such as phenol novolac-type epoxy resins, cresol novolac-type epoxy resins, and dicyclopentadiene derivatives; and aromatic epoxy resins, such as biphenyl-type, biphenyl aralkyl-type, naphthyl-type, and bisphenol-type epoxy resins. A single type of these epoxy resins may be used, or two or more may be mixed and used. The properties of the epoxy resin are also not particularly limited, and the epoxy resin may be either a liquid or a solid at ambient temperature (25° C.). For example, the epoxy resin may be a solid cresol novolac-type epoxy resin. The solid cresol novolac-type epoxy resin can be obtained as a commercially available product, and examples thereof include N670 (available from DIC Corporation). Further, for example, the epoxy resin may be a liquid epoxy resin, and specific examples thereof include a bisphenol A-type epoxy resin and a bisphenol F-type epoxy resin. The liquid bisphenol A-type epoxy resin is commercially available, such as, for example, EPOMIK (trade name) R140 (available from Mitsui Chemicals, Inc.).

Note that in the present disclosure, the liquid epoxy resin refers to an epoxy resin that is in a liquid form at 25° C.

An epoxy equivalent weight of the epoxy resin may be 140 or more from the viewpoint of thermal mechanical nature of the molded body using the electromagnetic interference suppressing material. From the viewpoint of the electromagnetic wave absorption performance, the epoxy equivalent weight may be 200 or more. The upper limit value of the epoxy equivalent weight may be 400 or less, or may be 380 or less from the viewpoint of the thermal mechanical nature.

The epoxy resin may include a polyoxyalkylene structure represented by $(R^1O)m$ and a polyoxyalkylene structure represented by $(R^2O)n$.

Here, $R^1$ and $R^2$ each independently represent an alkylene group having one or more carbons. m+n may be from 1 to 50, or may be from 1 to 20. m may be from 0 to 49, or may be from 0 to 19. n may be from 1 to 50, or may be from 1 to 20.

Examples of the alkylene groups represented by $R^1$ and $R^2$ include a C1-6 alkylene group, and specifically include a methylene group, an ethylene group, a trimethylene group, a propylene group, a tetramethylene group, and a hexamethylene group. From the viewpoint of the electromagnetic wave absorption performance, each of the alkylene groups may be a methylene group or an ethylene group.

Of the quantity m of the $R^1O$ groups, the plurality of $R^1$ may all be the same alkylene group, or may be alkylene groups with different numbers of carbons. Of the quantity n of the $R^2O$ groups, the plurality of $R^2$ may all be the same alkylene group, or may be alkylene groups with different numbers of carbons.

Examples of the epoxy resin including the polyoxyalkylene structure include liquid epoxy resins including a bisphenol A skeleton, and polyethylene glycol diglycidyl ether. An example of a commercially available product of the liquid epoxy resin including the bisphenol A skeleton includes Rikaresin BEO-60E (available from New Japan Chemical Co., Ltd.) expressed by the following general formula (1). An example of a commercially available product of the polyethylene glycol diglycidyl ether includes Epolite 400E (available from Kyoeisha Chemical Co., Ltd.), which contains a compound represented by the following general formula (2) as a main constituent.

[Chem. 1]

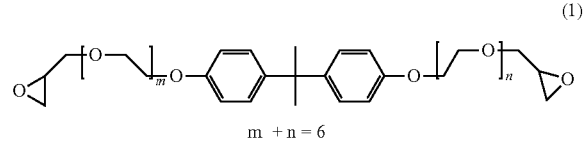

$$m + n = 6$$

[Chem. 2]

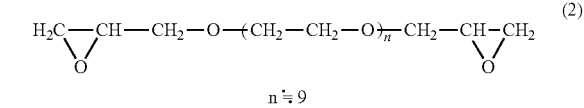

$$n \fallingdotseq 9$$

In the present disclosure, an example of the imide resin used as the organic substance include bis-allyl nadi-imide. Bis-allyl nadi-imide can be procured as a commercially available product, including, for example, BANI-M (available from Maruzen Petrochemical Co., Ltd.) and BANI-X (available from Maruzen Petrochemical Co., Ltd.).

In the present disclosure, the molecular structure, or the like, of the polyurethane used as the organic substance is not particularly limited, as long as the polyurethane is one that is commonly used in electronic components. The foamed polyurethane is generally obtained by adding a catalyst, a foaming aid, and the like to a polyol, a polyisocyanate, and a foaming agent as essential components, followed by reaction and foaming.

Examples of the polyol component include polyester polyols, polyether polyols, polycarbonate polyols, and polymer polyols. One type of these polyols may be used alone, or two or more types may be used in combination.

Examples of the polyester polyol can include polyester polyols containing: aliphatic dicarboxylic acids having from 4 to 20 carbon atoms such as adipic acid, suberic acid, sebacic acid, and brassylic acid, aromatic dicarboxylic acids such as terephthalic acid and isophthalic acid, and the like as acid components; and aliphatic diols having from 1 to 6 carbon atoms such as ethylene glycol, ether glycols such as diethylene glycol and dipropylene glycol, and the like as polyol components (alcohol components).

As the isocyanate component, various known polyfunctional aliphatic, alicyclic, and aromatic isocyanates can be used. Examples of the isocyanates can include tolylene diisocyanate (TDI), diphenylmethane diisocyanate (MDI), dicyclohexylmethane diisocyanate, triphenyl diisocyanate, xylene diisocyanate (XDI), polymethylene polyphenylene polyisocyanate, hexamethylene diisocyanate, isophorone diisocyanate (IPDI), o-toluidine diisocyanate, naphthylene diisocyanate, xylylene diisocyanate, and lysine diisocyanate. One type of these isocyanates may be used alone, or two or more thereof may be used in combination. Examples of the foaming agent include water, chlorofluorocarbon, and pentane.

In an aspect of the present disclosure, when the organic substance is a molded body, a content (mass %) of the organic substance in the electromagnetic interference suppressing material may be from 1 to 40 mass %, from 3 to 30 mass %, from 4 to 25 mass %, or from 5 to 20 mass % with respect to the total amount of the electromagnetic interference suppressing material from the viewpoint of further improving the electromagnetic wave absorption performance and the electromagnetic interference suppression performance.

In another aspect of the present disclosure, when the organic substance is a foam, the content (mass %) of the organic substance in the electromagnetic interference suppressing material may be from 80 to 99.95 mass %, from 90 to 99.9 mass %, or from 95 to 99.8 mass % with respect to the total amount of the electromagnetic interference suppressing material from the viewpoint of further improving the electromagnetic wave absorption performance and the electromagnetic interference suppression performance.

When a thermosetting resin is contained as the organic substance, the electromagnetic interference suppressing material of the present disclosure may further contain a curing agent, a curing accelerator, and the like.

Examples of the curing agent include aliphatic amines, aromatic amines, dicyandiamides, dihydrazide compounds, acid anhydrides, and phenolic resins. One type of these resins may be used, or two or more types may be used in combination.

Examples of the curing accelerator include organic peroxides such as dicumyl peroxide and dibutyl peroxide; imidazole compounds such as 2-methylimidazole and 2-ethylimidazole; organophosphorus-based compounds such as trimethylphosphine, triethylphosphine, tributylphosphine and triphenylphosphine; diazabicycloalkene compounds such as 1,8-diazabicyclo[5,4,0]undecene-7 (DBU) and 1,5-diazabicyclo(4,3,0)nonene-5; and tetraphenylboron-based compounds such as 2-ethyl-4-methylimidazole tetraphenylborate. One type of these resins may be used, or two or more types may be used in combination.

In an aspect of the present disclosure, when the electromagnetic interference suppressing material of the present disclosure contains a curing agent, a content thereof may be from 0 mass % to 150.0 mass %, from 0 mass % to 120 mass %, or from 0 mass % to 100 mass % with respect to 100 mass % of the thermosetting resin.

In another aspect of the present disclosure, when the electromagnetic interference suppressing material of the present disclosure contains a curing agent, the content thereof may be from 1.0 mass % to 20.0 mass %, from 2.0 mass % to 18.0 mass %, or from 3.0 mass % to 15.0 mass % with respect to the total amount of the electromagnetic interference suppressing material.

When the electromagnetic interference suppressing material of the present disclosure contains a curing accelerator, a content thereof may be from 0.01 mass % to 10.0 mass % or less, from 0.05 mass % to 5.0 mass % or less, or from 0.1 mass % to 3.0 mass % or less with respect to the total amount of the electromagnetic interference suppressing material.

The electromagnetic interference suppressing material of the present disclosure may further include a dispersion aid. The dispersion aid may be any material that stably and highly disperses fine particles in a matrix resin, and generally, coupling agents and surfactants having functional groups with different reactivity in a single molecule are used. Examples of the dispersion aid include surfactants, which include anionic surfactants such as carboxylates, and cationic surfactants such as quaternary ammonium salts; coupling agents having an amine-based functional group and a sulfide-based functional group, and cellulose nanofibers.

The cellulose nanofibers are bipolar micro-solids and improve the dispersibility of a filler through a surface-active action. The cellulose nanofibers may be already highly dispersed in a liquid such as water or a thermosetting resin oligomer.

From the perspectives of workability and fluidity, the average fiber length of the cellulose nanofibers may be from 1 μm to 100 μm, or from 5 μm to 50 μm.

The average fiber diameter of the cellulose nanofibers, including aggregates, may be from 1 nm to 1000 nm, or from 4 nm to 500 nm. When the average fiber diameter is in the above range, the dispersibility of the powder carbon material can be increased, and the electromagnetic interference suppression performance can be further improved.

Note that the average fiber length and the average fiber diameter of the cellulose nanofibers can be measured using a scanning electron microscope (SEM) through the same operation used to obtain the average fiber length and average fiber diameter of the carbon nanotubes described above.

Examples of commercially available products of the coupling agent having an amine-based functional group and a sulfide-based functional group include SUMILINK (trade name) 100 (available from Sumitomo Chemical Co., Ltd.). Examples of commercially available products of the cellulose nanofibers include ELLEX-S (available from Oji Paper Co., Ltd.).

When the electromagnetic interference suppressing material of the present disclosure includes the dispersion aid, a content thereof may be from 0.1 to 30 mass %, from 0.2 to 10 mass %, or from 0.3 to 5 mass % with respect to the total amount of the electromagnetic interference suppressing material from the viewpoint of the dispersibility and retention of thermomechanical properties.

In addition to each of the components described above, the electromagnetic interference suppressing material of the present disclosure can be compounded, as necessary, with additives generally blended in this type of electromagnetic interference suppressing material without departing from the gist of the present disclosure, examples of the additives including release agents, such as synthetic waxes, natural waxes, higher fatty acids, and esters of higher fatty acids; colorants, such as cobalt blue; modifiers, such as silicone oil or silicone rubber; hydrotalcites; ion scavengers; electrostatic charge-controlling agents; and flame retardants such as phosphazene. One type of these additives may be used, or two or more types may be mixed and used.

A content of these additives in the electromagnetic interference suppressing material of the present disclosure may be from 0.05 to 30.0 mass % or from 0.2 to 20.0 mass % as a total amount of the additives with respect to the total amount of the electromagnetic interference suppressing material.

[Inorganic Substance]

The inorganic substance contained in the base material is not particularly limited, as long as it is an inorganic substance used in electronic components, and examples thereof include inorganic substances (A) and inorganic substances (B) which will be described below.

One type of these resins may be used, or two or more types may be used in combination.

(Inorganic Substance (A))

The inorganic substance (A) is at least one selected from the group consisting of: inorganic fillers such as silica, alumina, magnesium oxide, titanium oxide, barium titanate, silicon nitride, aluminum nitride, silicon carbide and tungsten carbide; soft magnetic materials such as amorphous magnetic metal alloys, Ni—Fe alloys, pure iron, mild steel, silicon steel (Fe—Si alloys), Fe—Al alloys, Fe—Si—Al alloys, Co—Fe-based alloys, and carbonyl iron; and magnetic bodies such as magnetite and ferrite and is an inorganic substance other than the inorganic substance (B) which will be described later.

The inorganic substance (A) may be used together with the organic substance. From the viewpoint of reducing an expansion coefficient or increasing a thermal conductivity of the electromagnetic interference suppressing material, silica and/or alumina may be used, or silica may be used. In addition, from the viewpoint of further improving the electromagnetic wave absorption performance and the electromagnetic interference suppression performance, ferrite and/or amorphous magnetic metal alloys may be used.

A shape of the inorganic substance (A) is not particularly limited, and examples thereof include a powder shape, a spherical shape, a flake shape, and a fibrous shape. The shape of the inorganic substance may be a powder shape or a spherical shape.

An average particle diameter of the inorganic substance (A) is not particularly limited, and may be from 0.1 μm to 100 μm, from 0.2 μm to 75 μm, or from 0.2 μm to 50 μm. Note that in the present specification, the average particle diameter is the volume average particle size, and the average particle size of the inorganic substance (A) can be calculated as an average value of the long diameter of the particles, measured using a laser diffraction-type device for measuring the particle size distribution.

When the inorganic substance (A) is contained in the electromagnetic interference suppressing material of the present disclosure, a content thereof may be from 30 to 92 mass %, from 40 to 90 mass %, or from 50 to 88 mass % with respect to the total amount of the electromagnetic interference suppressing material from the viewpoint of further improving the electromagnetic wave absorption performance and the electromagnetic interference suppression performance.

When the electromagnetic interference suppressing material of the present disclosure is used as a semiconductor sealing material, metal foreign matter is removed in the process of producing the semiconductor sealing material. When the metal foreign matter is removed using a magnet, the magnetic body is considered to be foreign matter and is removed, and thus the yield is poor. From such a perspective, when the electromagnetic interference suppressing material of the present disclosure contains the magnetic body, a content of the magnetic body may be 1 mass % or less, 0.5 mass % or less, or 0 mass % or less with respect to the total amount of the electromagnetic interference suppressing material. Since specific gravity of the magnetic body is large, the content of the magnetic body may be equal to or less than the above-described values from the perspective of weight reduction of the resulting molded body.

(Inorganic Substance (B))

The inorganic substance (B) is a ceramic.

Specific examples of the ceramic include, but are not limited to, sintered bodies containing a metal oxide, nitride, carbide, or the like as a main component.

Specific examples of the metal oxide include alumina, zirconia, and magnesium oxide.

Specific examples of the metal nitride include aluminum nitride, boron nitride, and silicon nitride.

Specific examples of the metal carbide include silicon carbide and boron carbide.

The ceramic may be a sintered body of alumina and/or aluminum nitride. The ceramic may be a molded body, or may be porous alumina or the like which is a foam.

[Method for Producing Powder Carbon Material]

Hereinafter, an embodiment of a method for producing a powder carbon material of the present disclosure will be described, but the present disclosure is not limited to the following embodiment.

The powder carbon material according to the present disclosure can be produced by, for example, a method including a first step of coating a carbon layer on a template of particles of alumina, magnesium oxide, or the like and preparing carbon-coated particles, a second step of dissolving and removing the template, and a third step of performing a heat treatment. Such a method can easily produce a powder carbon material having a high specific surface area in which graphene has an average number of layers of 4 or less.

First Step

Template

The template at the time of synthesizing the powder carbon material of the present embodiment needs to be capable of introducing the organic substance on a surface of the material and inside voids thereof, to stably maintain the original structure during a CVD treatment, and to be capable of being easily separated from the formed powder carbon material. Therefore, it may have good heat resistance and can be removed with an acid or an alkali.

The resulting powder carbon-based material has voids reflecting the shape of the template itself.

In other words, a carbon material is synthesized in a state in which the form of the template is transferred. Therefore, the template may be a material having a material uniform in structure and composition with a uniform particle diameter, and a powder carbon material having pores of a controlled size by using such a material. In addition, in order to obtain a high specific surface area, a material capable of controlling the average number of layers of graphene to be obtained to 4 or less may be used.

Examples of such a template include particles of alumina, silica, magnesium oxide, tungsten carbide, aluminum nitride, cerium oxide, titanium oxide, and calcium carbonate. These particles may be nanoparticles. From the viewpoint of material properties to be possessed by the template and the physical properties of the resulting powder carbon material, these particles may be particles of alumina and/or magnesium oxide, alumina particles, or alumina nanoparticles. The type of alumina is not particularly limited, and may be θ-alumina or γ-alumina.

An average particle diameter of the particles used in the template is not particularly limited, and may be from 4 to 100 nm, or from 5 to 20 nm. An average particle diameter of 4 nm or more results in easy handling and good carbon coatability. In addition, gas permeability of a carbon source is improved when the carbon source is coated, and thus uniform carbon coating is facilitated. On the other hand, when the average particle diameter is 100 nm or less, a powder carbon material having a high specific surface area (BET specific surface area) can be obtained. In addition, it is possible to reduce a decrease in yield of the powder carbon material due to a relative increase in amount of the template to be dissolved in the subsequent step.

The particles may be used in admixture with a particulate spacer. By using the spacer, it is possible to secure an appropriate gap between the particles, and to reduce pressure loss due to excessively dense packing of the particles. The spacer may be a particle having an average particle diameter of, for example, from 100 to 5000 μm. The material for the spacer is not particularly limited as long as it can be sieved after carbon coating, and may be a material that does not decompose at from 900 to 1000° C. Alternatively, it may be one which can be dissolved and removed simultaneously with the template. Examples of the material include quartz sand, silica, alumina, silica-alumina, and titania. For example, when quartz sand is used, the quartz sand may be washed with an acid in advance, fired at from 600 to 1000° C. for from 1 to 5 hours, and controlled to have the above-described particle diameter.

A blending ratio of the particles to the spacer is not particularly limited, and may be, for example, from 0.1:10 to 10:10 or from 1:10 to 10:10 in terms of a mass ratio of (particles:spacer). Within this range, the powder carbon material may be obtained at a high yield.

Coating with Carbon Layer

The method for coating the surface of the particle serving as the template with the carbon layer is not particularly limited, and either a wet method or a dry method can be applied. From the viewpoint of setting the average number of layers of graphene to 4 or less, a chemical vapor deposition (CVD) method may be used.

The CVD method used for introducing an organic compound and depositing a carbon layer on a template is an industrial method for forming a thin film composed of a specific element or element composition (for example, a thin film composed of carbon) on a substrate such as a template. In general, this is a technique utilizing a phenomenon in which energy is given to a gas containing a raw material by heat or light, or the raw material is converted into plasma at a high frequency, whereby the raw material is radicalized by chemical reaction or thermal decomposition to be rich in reactivity, and the raw material is adsorbed and deposited on the substrate.

The organic compound used in the CVD method may be a gas at room temperature or may be one that can be vaporized. The method of vaporization includes, for example, a method of heating to the boiling point or higher and a method of reducing the pressure in the atmosphere. The organic compound to be used can be appropriately selected from carbon source substances. In particular, the organic compound may be a compound that is thermally decomposed by heating, or a compound that can deposit a carbon layer on the surface of the particle used as the template.

The organic compound to be used may be an organic compound containing hydrogen. The organic compound may be an organic compound containing an unsaturated or saturated hydrocarbon, or a mixture thereof.

The organic compound to be used may be an unsaturated linear or branched hydrocarbon having a double bond and/or a triple bond, a saturated linear or branched hydrocarbon, a saturated cyclic hydrocarbon, an aromatic hydrocarbon such as benzene or toluene, or the like. As the organic compound, alcohols such as methanol and ethanol, or compounds containing nitrogen such as acetonitrile and acrylonitrile may be used. Examples of the organic compound include acetylene, methylacetylene, ethylene, propylene, isoprene, cyclopropane, methane, ethane, propane, benzene, toluene, a vinyl compound, ethylene oxide, methanol, ethanol, acetonitrile, and acrylonitrile. One type of these organic compounds may be used, or two or more types may be used in combination. Among them, the organic compound to be used may be a compound capable of entering the gap between the particles, such as acetylene, ethylene, propylene, methane, or ethane. Methane, propylene, and benzene may be used from the viewpoint of depositing highly crystalline carbon. Methane may be used from the viewpoint of providing carbon having a high thermal decomposition temperature and high crystallinity.

The organic compound used in CVD at a higher temperature and the organic compound used in CVD at a lower temperature may be the same or different from each other. For example, acetylene, ethylene, and the like may be used in CVD at a low temperature, and propylene, isoprene, benzene, and the like may be used in CVD at a high temperature.

When the organic compound is introduced onto the particles, the particles may be placed under reduced pressure in advance, or the system itself may be placed under reduced pressure. Any method may be used as long as carbon is deposited by CVD. For example, carbon generated by a chemical reaction or thermal decomposition of an organic compound may be deposited (or adsorbed) on alumina particles to coat the alumina particles with a carbon layer.

A pressure at which the CVD treatment is performed is not particularly limited and may be, for example, from 1 kPa to 200 kPa or from 50 to 150 kPa. Any heating temperature condition at the time of performing the CVD treatment may be used as long as several carbon layers or less can be formed on the particles, and an appropriate temperature can be appropriately selected depending on the organic compound to be used. The heating temperature may be from 400 to 1500° C., from 450 to 1100° C., or from 550 to 950° C. For example, when propylene is used as the organic compound, the temperature may be from 700 to 900° C., and, when methane is used as the organic compound, the temperature may be from 900 to 1100° C. However, the temperature may be lower than the decomposition temperature of the organic compound by about from 50 to 200° C. When heating is performed to a temperature equal to or higher than the decomposition temperature of the organic compound, vapor phase carbon deposition becomes remarkable. However, by performing the above-described method, for example, unevenness in amount of carbon deposition between the surfaces and the inside of the particles can be reduced, and carbon can be uniformly deposited.

The heating temperature can be appropriately selected depending on the CVD treatment time and/or the pressure in the reaction system. Alternatively, the product may be analyzed, and the temperature required to achieve a desired number of layers to be layered may be set based on the analysis results.

A rate of temperature increase during the CVD treatment is also not particularly limited, and may be from 1 to 50° C./min or from 5 to 20° C./min. The treatment time in the CVD treatment (CVD treatment time at a predetermined heating temperature) may be any time as long as graphene having an average number of layers of 4 or less is obtained, and an appropriate time can be selected depending on the organic compound to be used or the temperature. For example, the treatment time in the CVD treatment may be from 5 minutes to 8 hours, from 0.5 to 6 hours, or from 1 to 5 hours. Also, the product may be analyzed, and the time required for sufficient carbon deposition may be set based on the analysis results.

The CVD treatment may be performed under reduced pressure, in a vacuum, under pressure, or in an inert gas atmosphere. When the reaction is performed in an inert gas atmosphere, examples of the inert gas include nitrogen, helium, neon, and argon, and nitrogen may be used. In the CVD method, carbon can be easily deposited or adsorbed on particles in a gas phase by heating the particles while flowing a gaseous organic compound together with a carrier gas so as to be brought into contact with the particles. The type, flow rate and flow amount of the carrier gas and the heating temperature are appropriately adjusted depending on the type of the organic compound to be used. The carrier gas is, for example, the above-described inert gases, and may be nitrogen or a mixture thereof with oxygen gas or hydrogen gas.

From the viewpoint of setting the average number of layers of graphene to 4 or less, the flow rate of the carrier gas may be, for example, from 0.05 to 1.0 m/min or from 0.32 to 0.64 m/min. An amount of the organic compound to be introduced may be from 1 to 30 vol % or from 5 to 20 vol % with respect to a total amount of the carrier gas and the organic compound.

As a method of coating the particles with the carbon layer, an organic compound may be introduced by a wet method such as an impregnation method and carbonized. Before introducing the organic compound and performing CVD, the organic compound may be impregnated and carbonized. As the organic compound to be impregnated, for example, a thermally polymerizable monomer such as furfuryl alcohol having a high carbonization yield can be used. As a method for impregnating the particles with the organic compound, there can be employed known means such as bringing the particles into contact with the organic compound as it is or in a state in which the organic compound is mixed with a solvent if the organic compound is a liquid, or dissolved in a solvent if the organic compound is a solid.

After the first step, the carbon-coated particles may be subjected to a heat treatment to carbonize the carbon layer, and highly crystalline carbon may be deposited on the surfaces of the particles. In this way, the resulting powder carbon material has higher crystallinity and a higher specific surface area.

Since the carbonization of the carbon layer can also proceed by the CVD treatment, the heat treatment may be performed at the time of the CVD treatment or may be performed by another method.

The heat treatment method is not particularly limited, and the heat treatment may be performed using a high-frequency induction heating furnace or the like.

<Second Step>

The step of dissolving and removing the template, which is the second step of the present embodiment, is a step of dissolving and removing the template from the carbon-coated particles to obtain a shell-shaped body.

For dissolving and removing the template, for example, an alkaline solution such as NaOH, KOH, LiGH, RbOH, or CsOH may be used. For example, an alkali solution having a concentration of from 1 to 5 M may be used. The alkali solution may be 30 times or more, or 50 times or more of the stoichiometric ratio with respect to the particles. When the ratio is 30 times or more of the stoichiometric ratio, it is possible to suppress the remaining of particles which are the templates. At the time of dissolution and removal, for example, the carbon-coated particles may be placed in the alkali solution and subjected to a heat treatment at a heat treatment temperature of from 200 to 300° C. At this time, for the purpose of bringing the alkaline solution into uniform contact with a sample, the sample of the carbon-coated particles may be pulverized in advance. A rate of temperature increase during the heat treatment is not particularly limited, and is, for example, from 200 to 300° C./hour. A heat treatment time (retaining time at a predetermined heat treatment temperature) is not particularly limited and is, for example, from 1 to 5 hours. The step of dissolution and removal may be performed plural times. The product can be analyzed, and conditions required for sufficient template removal can be set based on the analysis results.

After dissolving and removing the template, for example, the shell-shaped body may be recovered by filtration or may be dried by vacuum heating. Vacuum heating drying conditions are not particularly limited, and, for example, a vacuum heating drying temperature can be set to from 100 to 200° C. A vacuum heating drying time can be, for example, from 1 to 10 hours.

Third Step

The third step is a heat treatment step. Through the third step after the second step, the crystallinity of the coated carbon is enhanced and stabilized. Therefore, the powder carbon material has higher levels of conductivity, corrosion resistance, and high specific surface area.

A heat treatment temperature is not particularly limited, and may be from 1100 to 1850° C. or from 1550 to 1830° C. When the heat treatment temperature is 1550° C. or higher, the effects of the present invention can be more remarkably obtained. When the temperature is 1850° C. or lower, it is possible to prevent the remaining template from reacting with carbon.

A heat treatment time (retaining time at a predetermined heat treatment temperature) may be from 0.1 to 10 hours, from 0.2 to 5 hours, or from 0.5 to 2 hours. Note that the heat treatment step may be performed under reduced pressure.

Graphene having an average number of layers of 4 or less can be obtained by the method including the first step to the third step.

[Method for Producing Electromagnetic Interference Suppressing Material]

In an aspect of the present disclosure, when a molded body (not a foam) is used as the organic substance, the electromagnetic interference suppressing material may be obtained by sufficiently uniformly mixing a base material containing at least one organic substance, a powder carbon material, and any other component to be blended as necessary with a mixer or the like, and then performing a kneading process with a disperser, a kneader, a three roll mill, a twin-screw heating roll, a twin-screw heating extruding kneader, or the like. The kneading process may be implemented with heating. The temperature when heating may be from 70° C. to 150° C. or from 75° C. to 120° C.

After the kneading process, the electromagnetic interference suppressing material of the present disclosure may be, for example, cooled and solidified, pulverized to an appropriate size using a cutting mill, a ball mill, a cyclone mill, a hammer mill, a vibration mill, a cutter mill, a grinder mill, a speed mill, or the like, and then used.

The mixture obtained after the kneading process may be pressed and molded into a sheet shape in a molding machine at a temperature of from 50° C. to 100° C. and a pressure of from 0.5 MPa to 1.5 MPa.

The electromagnetic interference suppressing material of the present disclosure can be used as a radio wave absorbing material, a noise suppression sheet, a semiconductor sealing material, a sealing sheet, an electric wire covering material, or the like.

As an embodiment of the present disclosure, for example, a resin-sealed electronic component can be obtained by sealing a semiconductor element fixed on a substrate with a semiconductor element sealing material containing the electromagnetic interference suppressing material of the present disclosure.

Note that a known molding method can be used without particular limitation to produce an electronic component. The most common molding method is low pressure transfer molding, but the molding can also be implemented by injection molding, cast molding, compression molding, and the like.

For example, when the transfer molding method is used, a heating treatment is implemented in a molding die using a transfer molding machine at a temperature of from 150° C. to 200° C. for a time of from 20 seconds to 200 seconds, a molded article is removed from the molding die, and the molded article is subjected to a heating treatment at a temperature of from 150° C. to 200° C. for 2 hours to 12 hours to complete the curing.

When the compression molding method is used, first, a substrate on which a semiconductor element is mounted is supplied to an upper mold of a mold die, and the electromagnetic interference suppressing material of the present disclosure is supplied into a cavity of a lower mold. Subsequently, the upper and lower molds are clamped at a required mold clamping force, and thereby the substrate on which the semiconductor element is mounted is immersed into the electromagnetic interference suppressing material heated and melted inside the cavity of the lower mold. Afterwards, the electromagnetic interference suppressing material heated and melted inside the lower mold cavity is pressed by a cavity bottom surface member, a required pressure is applied under reduced pressure, and the resin composition is compression molded. The molding conditions may include a temperature of from 120° C. to 200° C. and a pressure of from 2 MPa to 20 MPa.

In another aspect of the present disclosure, when the inorganic substance (B) is used as the base material, a material for electromagnetic interference is obtained by the following method. An appropriate organic binder, a solvent and the like are added to and mixed with a raw material powder of a ceramic to produce a slurry. A ceramic green sheet is produced by forming this slurry into a sheet by employing a known doctor blade method or the like. This ceramic green sheet is fired to obtain a ceramic. The material for electromagnetic interference may be obtained by immersing the resulting ceramic in a mixed dispersion obtained by dispersing a powder carbon material in a solvent and blending other components, as necessary. Alternatively, it may be obtained by firing a component that can form a ceramic green sheet and a powder carbon material. Conditions for firing a component that can form a ceramic and the powder carbon material are not particularly limited, and may be appropriately adjusted according to the component that can form a ceramic. The firing may be carried out in an inert gas atmosphere. A firing temperature may be from 600° C. to 1800° C. or from 1000° C. to 1600° C.

In still another aspect of the present disclosure, an electromagnetic interference suppressing material including a foam as an organic substance or an inorganic substance may be obtained by immersing the foam in a mixed dispersion obtained by dispersing a powder carbon material in a solvent and blending other components, as necessary. Alternatively, it may be obtained by, for example, a method in which a component that can form a foam, a powder carbon material, and any other component to be blended as necessary are foamed by a foaming machine, or a method in which the components are molded with a pressure press, and the resulting molded product is then fired in the atmosphere for foaming.

The conditions for foaming these components are not particularly limited and may be appropriately adjusted depending on the component that can be a foam.

EXAMPLE

The present disclosure will be specifically described through examples; however, the present disclosure is not limited in any way to these examples.

Production of Powder Carbon Material

Production Example 1

Production of Carbon-Coated Alumina Nanoparticle

Alumina nanoparticles (TM300 available from Taimei Chemicals Co., Ltd., crystal phase: γ-alumina, average particle diameter: 7 nm, specific surface area: 220 m$^2$/g) and silica sand as a spacer (available from SendaiWako Pure Chemical, Ltd.) were mixed at a mass ratio of 3:20 (alumina nanoparticles:silica sand). The silica sand used was silica sand soaked in 1 M hydrochloride for 12 hours, heated at 800° C. for 2 hours in air in a muffle oven, and sieved at intervals of 180 m. The mixture of alumina nanoparticles and silica sand prepared above was placed in a reaction tube (internal diameter: 37 mm), and CVD using methane as a carbon source (methane CVD) was carried out.

In the methane CVD, under the condition that the flow rate of $N_2$ gas was adjusted to 224 ml/min, the alumina nanoparticles were heated from room temperature to 900° C. at a rate of temperature increase of 10° C./min and retained at 900° C. for 30 minutes. Thereafter, $N_2$ gas was used as a carrier gas, methane was introduced into the reaction tube in an amount of 20 vol % with respect to the total amount of the carrier gas and methane, and a chemical vapor deposition (CVD) process was performed at 900° C. for 2 hours. At this time, the flow rates of the methane gas and the $N_2$ gas were adjusted to 45 ml/min and 179 ml/min, respectively. Thereafter, the introduction of the methane gas was stopped, and, under the condition that the flow rate of the $N_2$ gas was adjusted to 224 ml/min, the alumina nanoparticles were retained at 900° C. for 30 minutes and then cooled to obtain carbon-coated alumina nanoparticles.

Dissolution and Removal of Template

The carbon-coated alumina nanoparticles and 5 M NaOH (50 times or more of the stoichiometric ratio) were placed in an autoclave vessel made of Teflon (trade name), heated at a rate of temperature increase of 250° C./hour using a muffle furnace, and retained at 250° C. for 2 hours. Thereafter, the alumina nanoparticles were naturally cooled, recovered by filtration, and dried by vacuum heating at 150° C. for 6 hours to obtain a shell-shaped body.

Heat Treatment

The shell-shaped body obtained in the above procedure (dissolution and removal of the template) was crushed, and several fragments were collected and placed in a graphite crucible, which was set in an induction heating furnace. The reaction tube was evacuated with an oil pump to remove air and allowed to stand for 30 minutes. Thereafter, the inside of the system was heated by induction heating with water flowing through a water-cooling jacket of the reaction tube, and heat treatment was carried out to obtain a powder carbon material. The heat treatment was performed under vacuum. Heat treatment conditions were as follows: first, the temperature was raised from room temperature to 1000° C. at 16.7° C./min over 60 minutes, then raised to 1800° C. at 5° C./min over 160 minutes, heated at 1800° C. for 60 minutes, and then naturally cooled to room temperature to obtain powder carbon material 1 (second shell-shaped body).

Production Example 2

Production of Carbon-Coated Alumina Nanoparticle

Alumina nanoparticles (TM300 available from Taimei Chemicals Co., Ltd., crystal phase: γ-alumina, average particle diameter: 7 nm, specific surface area: 220 m²/g) and silica sand as a spacer (available from SendaiWako Pure Chemical, Ltd.) were mixed at a mass ratio of 3:20 (alumina nanoparticles:silica sand). The silica sand used was silica sand soaked in 1 M hydrochloride for 12 hours, heated at 800° C. for 2 hours in air in a muffle oven, and sieved at intervals of 180 m. The mixture of alumina nanoparticles and silica sand prepared above was placed in a reaction tube (internal diameter: 37 mm), and CVD using methane as a carbon source (methane CVD) was carried out.

In the methane CVD, under the condition that the flow rate of $N_2$ gas was adjusted to 224 ml/min, the alumina nanoparticles were heated from room temperature to 900° C. at a rate of temperature increase of 10° C./min and retained at 900° C. for 30 minutes. Thereafter, $N_2$ gas was used as a carrier gas, methane was introduced into the reaction tube in an amount of 20 vol % with respect to the total amount of the carrier gas and methane, and a chemical vapor deposition (CVD) process was performed at 900° C. for 6 hours. At this time, the flow rates of the methane gas and the $N_2$ gas were adjusted to 45 ml/min and 179 ml/min, respectively. Thereafter, the introduction of the methane gas was stopped, and, under the condition that the flow rate of the $N_2$ gas was adjusted to 224 ml/min, the alumina nanoparticles were retained at 900° C. for 30 minutes and then cooled to obtain carbon-coated alumina nanoparticles.

Dissolution and Removal of Template

The same operation as in Production Example 1 was carried out.

Heat Treatment

A powder carbon material 2 (second shell-shaped body) was obtained by the same operation as in Production Method 1.

Comparative Production Example 1

Production of Carbon-Coated Alumina Nanoparticle

Alumina nanoparticles (TM300 available from Taimei Chemicals Co., Ltd., crystal phase: γ-alumina, average particle diameter: 7 nm, specific surface area: 220 m²/g) and silica sand as a spacer (available from SendaiWako Pure Chemical, Ltd.) were mixed at a mass ratio of 3:20 (alumina nanoparticles:silica sand). The silica sand used was silica sand soaked in 1 M hydrochloride for 12 hours, heated at 800° C. for 2 hours in air in a muffle oven, and sieved at intervals of 180 m. The mixture of alumina nanoparticles and silica sand prepared above was placed in a reaction tube (internal diameter: 37 mm), and CVD using methane as a carbon source (methane CVD) was carried out.

In the methane CVD, under the condition that the flow rate of $N_2$ gas was adjusted to 224 ml/min, the alumina nanoparticles were heated from room temperature to 950° C. at a rate of temperature increase of 10° C./min and retained at 950° C. for 30 minutes. Thereafter, $N_2$ gas was used as a carrier gas, methane was introduced into the reaction tube in an amount of 20 vol % with respect to the total amount of the carrier gas and methane, and a chemical vapor deposition (CVD) process was performed at 950° C. for 20 hours. At this time, the flow rates of the methane gas and the $N_2$ gas were adjusted to 45 ml/min and 179 ml/min, respectively. Thereafter, the introduction of the methane gas was stopped, and, under the condition that the flow rate of the $N_2$ gas was adjusted to 224 ml/min, the alumina nanoparticles were retained at 950° C. for 30 minutes and then cooled to obtain carbon-coated alumina nanoparticles.

Dissolution and Removal of Template

The same operation as in Production Example 1 was carried out.

Heat Treatment

A powder carbon material 3 (second shell-shaped body) was obtained by performing the same operation as in Production Method 1.

Measurement Evaluation of Powder Carbon Material

The obtained powder carbon materials were subjected to measurement evaluation for the following items. The measurement evaluation results are summarized in Table 1.

Specific Surface Area (BET Specific Surface Area)

The obtained powder carbon material was dried by vacuum heating at 150° C. for 6 hours, and then the specific surface area was determined by a multipoint method from a nitrogen adsorption isotherm measured using a high-precision automatic gas/vapor adsorption amount measuring device "BEL SORP MAX" (available from Bel Japan, Inc.).

Average Number of Layers of Graphene

From the specific surface area determined by the above-described method, the average number of layers of graphene was determined by the following equation.

Average number of layers of graphene=2627 $(m^2/g)$/specific surface area $(m^2/g)$ Pore Volume The obtained powder carbon material was dried by vacuum heating at 150° C. for 6 hours, and then subjected to nitrogen adsorption isotherm measurement using a high-precision automatic gas/vapor adsorption amount measuring device "BEL SORP MAX" (available from Bel Japan, Inc.) to determine the pore volume per material mass from the adsorption amount at a relative pressure (P/PO) of 0.96.

TABLE 1

| | | BET specific surface area [m²/g] | Average number of layers of graphene | Pore volume [cc/g] |
|---|---|---|---|---|
| Production Example 1 | Powder carbon material 1 | 1690.0 | 1.6 | 2.7 |
| Production Example 2 | Powder carbon material 2 | 836.6 | 3.1 | 1.3 |
| Comparative Production Example 1 | Powder carbon material 3 | 451.4 | 5.8 | 0.7 |

Production of Electromagnetic Interference Suppressing Material

The details of the components presented in Tables 2 and 3 used in the production of the electromagnetic interference suppressing material are as follows.

Organic Substance

Epoxy resin: EPICLON N670; cresol novolac-type epoxy resin; available from DIC Corporation, epoxy equivalent: 210

Inorganic Substance

Silica: FB105; available from Denka Co., Ltd., average particle diameter: 12 m

Carbon Material

Carbon black (CB): TPK1227R; available from Cabot Corporation, average particle diameter: 0.1 m
Carbon nanotube (CNT): LUCAN; available from LG; average fiber length: 30 m, average fiber diameter: 0.02 m Additive Curing agent: BRG-557; phenol novolac resin; available from Aica Kogyo Co., Ltd.

Curing accelerator: Curezol C11Z; imidazole compound; available from Shikoku Chemicals Corporation
Flame retardant: Rabitle (phosphazene-based flame retardant) FP100; available from Mitsui Fine Chemicals, Inc.

The powder carbon materials 1 to 3 presented in Tables 2 and 3 used in the production of the electromagnetic interference suppressing material were pulverized products of the powder carbon materials 1 to 3 obtained in Production Examples 1 and 2 and Comparative Production Example 1, respectively, and the powder carbon materials 1 to 3 were each pulverized and classified, prepared into an average particle diameter of 10 μm, and used.

Examples 1 to 3 and Comparative Examples 1 to 5

Each component of the type and blending amount presented in Table 2 was inserted into a Henschel mixer and mixed, after which the mixture was inserted into a twin-screw kneader heated to 110° C., and the mixture was heated and kneaded until becoming uniform. The heated and kneaded product was inserted into a cold roll, extended into a sheet shape, and then pulverized, and an electromagnetic interference suppressing material composition was produced. The obtained electromagnetic interference suppressing material composition was compression-molded into a molded body having a thickness of 0.5 mm, 1.0 mm, or 25 mm (temperature: 175° C., pressure: 10 MPa) to obtain an electromagnetic interference suppressing material.

Example 4

Adipic acid, diethylene glycol, and trimethylolpropane were placed in a flask, and heated and mixed at 120° C.; triisopropyl titanate was added thereto; and the mixture was dehydrated at 240° C. under reduced pressure to prepare an adipic acid-based polyester polyol.

Ten (10) parts by mass of the adipic acid-based polyesterpolyol, 70 parts by mass of a terephthalic acid-based polyesterpolyol "Terol 250" (available from OXID), 20 parts by mass of an ethylenediamine-based polyetherpolyol "AE-300" (available from Mitsui Chemicals, Inc.), 15 parts by mass of a flame retardant "TMCPP" (available from Daihachi Chemical Industry Co., Ltd.), 1 part by mass of a foam stabilizer "L-5340" (available from Nippon Unicar Co., Ltd.), 2.5 parts by mass of a catalytic agent "KL-31" (available from Kao Corporation), 35 parts by mass of a foaming agent "HFC-245fa" and 1.5 parts by mass of water were mixed to obtain a polyol mixture.

The obtained polyol mixture and an isocyanate "Sumidur 44V20" (available from Sumika Bayer Urethane Co., Ltd.) were prepared, mixed and stirred so that a urethane index was 105, and the obtained mixture was placed in a mold and molded into a size of 440 mm×440 mm×25 mm to obtain a rigid polyurethane foam (foamed polyurethane). Separately, a rigid polyurethane foam having a size of 440 mm×440 mm×25 mm was obtained by the same operation, and cut into 440 mm×440 mm×0.5 mm or 440 mm×440 mm×1.0 mm.

Next, a mixed dispersion 1 was prepared by mixing 1 part by mass of the powder carbon material 1 obtained in Production Example 1 with 10000 mL of a urethane-based emulsion "Superflex" (available from DKS Co. Ltd.). The obtained foamed polyurethane was immersed in the mixed dispersion 1 at room temperature for 30 minutes and then heated and dried at 120° C. for 120 minutes to obtain an electromagnetic interference suppressing material in which the powder carbon material was localized on surfaces of the foamed polyurethane.

Example 5 and Comparative Examples 6 to 8

An electromagnetic interference suppressing material in which the powder carbon material was localized on the surfaces of the foamed polyurethane was obtained in the same manner as in Example 4 except that a powder carbon material 2 was used in Example 5, that a powder carbon material 3 was used in Comparative Example 6, that carbon black (CB) was used in Comparative Example 7, and that carbon nanotube (CNT) was used in Comparative Example 8 instead of the powder carbon material 1.

Example 6

50 parts by mass of the polyol mixture produced in Example 4, 50 parts by mass of the isocyanate "Sumidur 44V20" (available from Sumika Bayer Urethane Co., Ltd.), and 1 part by mass of the powder carbon material 1 obtained in Production Example 1 were charged into an automatic mixing type injection foaming machine (model: MU-203S, model number: 6-018, available from Polyurethane Engineering Co., Ltd.), and foamed under the same forming conditions as in Example 4 to obtain an electromagnetic interference suppressing material which is a foamed polyurethane containing a powder carbon material of 440 mm×440 mm×0.5 mm, 440 mm×440 mm×1.0 mm, or 440 mm×440 mm×25 mm.

Comparative Examples 9 and 11

An electromagnetic interference suppressing material was obtained by the same operation as in Example 6 except that the powder carbon material 3 was used in Comparative Example 9, that carbon black (CB) was used in Comparative Example 10, and that carbon nanotube (CNT) was used in Comparative Example 11 instead of using the powder carbon material 1.

Example 7

An electromagnetic interference suppressing material in which the powder carbon material was localized on surfaces of a sintered ceramic porous body (foam) was obtained by the same operation as in Example 4 except that a sintered ceramic body "FA120" (available from Fuji Chemical Co., Ltd., alumina, average pore diameter: 100 m, average porosity: from 45 to 50%) were used instead of the foamed polyurethane.

Comparative Example 12

An electromagnetic interference suppressing material in which the carbon material was localized on surfaces of a sintered ceramic porous body was obtained by the same operation as in Example 7 except that carbon nanotube (CNT) was used instead of the powder carbon material 1.

Measurement Evaluation of Electromagnetic Interference Suppressing Material

The obtained electromagnetic interference suppressing materials were subjected to measurement evaluation for the following items. The measurement evaluation results are summarized in Tables 2 and 3.

In the "Carbon material existing region" in Table 3, the term "Surface" represents a case where the carbon material is localized on the surface of the electromagnetic interference suppressing material, and the term "Entirety" represents a case where the carbon material is present inside the electromagnetic interference suppressing material and on the surface thereof (entirety of the electromagnetic interference suppressing material).

Content (mass %) of Powder Carbon Material

The content of the powder carbon material was determined from the blending proportion thereof when the "Carbon material existing region" was "Entirety" (Examples 1 to 3 and 6, and Comparative Examples 1 to 5 and Comparative Examples 9 to 11), and from the mass increase between before and after the introduction of the carbon material into the surfaces when the "Carbon material existing region" was "Surface" (Examples 4, 5, and 7, and Comparative Examples 6 to 8 and 12).

Volume Resistance

The volume resistance at 150° C. was measured according to JIS K-6911:2006 using an electromagnetic interference suppressing material molded into a thickness of 1.0 mm.

Electromagnetic Wave Absorption Performance
(Frequency: 10 GHz, Near Field Measurement System)

An electromagnetic interference suppressing material molded into a thickness of 0.5 mm was installed between a high-frequency oscillating device and a reception antenna. The electromagnetic wave intensity when electromagnetic waves having a frequency of 10 GHz were generated was measured for both a case in which the molded body was present and a case in which the molded body was not present. The ratio of the electromagnetic wave intensities of both cases ((electromagnetic wave intensity when electromagnetic waves were absorbed by the electromagnetic interference suppressing material)/(electromagnetic wave intensity when the electromagnetic interference suppressing material was not present)) was then expressed in units of dB and used as electromagnetic wave-absorption performance.

Note that the electromagnetic wave intensity was measured in accordance with the "IEICE Transactions on Fundamentals of Electronics, Communications, and Computer Sciences B, Vol. J97-B, No. 3, pp. 279-285".

Electromagnetic Wave Absorption Performance
(Frequency: 5 GHz, Far Field Measurement System)

A 1 mm thick copper plate (600 mm×600 mm) was placed on an antireflection radio wave absorber, and a 25 mm thick electromagnetic interference suppressing material (440 mm×440 mm) was placed on a metallic plate. Next, an antenna was attached to a network analyzer via a cable, and electromagnetic waves having a frequency of 5 GHz were transmitted from one antenna, reflected by the electromagnetic interference suppressing material and the metallic plate placed below the electromagnetic interference suppressing material, and received by the other antenna to measure the electromagnetic wave intensity. In addition, the electromagnetic interference suppressing material was not placed on the metallic plate, and electromagnetic waves were radiated by the same operation as described above to measure the electromagnetic wave intensity. The ratio (electromagnetic wave intensity when electromagnetic waves were absorbed by the electromagnetic interference suppressing material/electromagnetic wave intensity when the electromagnetic interference suppressing material was not present) was defined as electromagnetic wave absorption performance in the units of dB.

The electromagnetic wave intensity was measured in accordance with "Reports of Kagoshima Prefectural Institute of Industrial Technology, No. 15 (2001), pp 53-61".

TABLE 2

| | Composition [parts by mass] | | | | | |
|---|---|---|---|---|---|---|
| | Base material | | | | | Carbon |
| | Organic substance | | | | | |
| | Thermosetting resin Epoxy resin | Curing agent Phenolic resin | Curing accelerator Imidazole | Flame retardant Phosphazene | Inorganic substance Silica | material Powder carbon material 1 |
| Example 1 | 13.3 | 6.2 | 0.4 | 10 | 70 | 0.2 |
| Example 2 | 13.3 | 6.2 | 0.4 | 10 | 70 | 0.4 |
| Example 3 | 13.3 | 6.2 | 0.4 | 10 | 70 | — |
| Comparative Example 1 | 13.3 | 6.2 | 0.4 | 10 | 70 | — |
| Comparative Example 2 | 13.3 | 6.2 | 0.4 | 10 | 70 | — |
| Comparative Example 3 | 13.3 | 6.2 | 0.4 | 10 | 70 | — |
| Comparative Example 4 | 13.3 | 6.2 | 0.4 | 10 | 70 | — |
| Comparative Example 5 | 13.3 | 6.2 | 0.4 | 10 | 70 | — |

| | Composition [parts by mass] | | | | Measurement evaluation | | |
|---|---|---|---|---|---|---|---|
| | Carbon material | | | | | Electromagnetic | |
| | Powder carbon material 2 | Powder carbon material 3 | CB | CNT | Volume resistance [Ω · cm] | wave absorption performance [dB] | |
| | | | | | | 10 GHz*[1] | 5 GHz*[2] |
| Example 1 | — | — | — | — | $1.0 \times 10^{12}$ | 10 | 5 |
| Example 2 | — | — | — | — | $1.0 \times 10^{9}$ | 20 | 8 |
| Example 3 | 0.2 | — | — | — | $1.0 \times 10^{9}$ | 10 | 5 |
| Comparative Example 1 | — | 0.2 | — | — | $1.0 \times 10^{14}$ | 5 | 2 |
| Comparative Example 2 | — | — | 0.3 | — | $1.0 \times 10^{14}$ | 0 | 0 |
| Comparative Example 3 | — | — | 1 | — | $1.0 \times 10^{14}$ | 3 | 1 |
| Comparative Example 4 | — | — | — | 0.3 | $1.0 \times 10^{6}$ | 9 | 3 |
| Comparative Example 5 | — | — | — | 1 | 30 | — | — |

*[1]Near field measurement system
*[2]Far field measurement system

TABLE 3

| | | | | Measurement evaluation | | |
|---|---|---|---|---|---|---|
| | Composition Carbon material | Carbon material existing region*[3] | Powder carbon material content [mass %] | Volume resistance [Ω · cm] | Electromagnetic wave absorption performance [dB] | |
| | | | | | 10 GHz*[1] | 5 GHz*[1] |
| Example 4 | Powder carbon material 1 | Surface | 0.3 | $1.0 \times 10^{3}$ | 20 | 10 |
| Example 5 | Powder carbon material 2 | Surface | 0.3 | $1.0 \times 10^{3}$ | 18 | 9 |
| Comparative Example 6 | Powder carbon material 3 | Surface | 0.3 | $1.0 \times 10^{2}$ | 7 | 6 |

TABLE 3-continued

| | Composition Carbon material | Carbon material existing region*3 | Powder carbon material content [mass %] | Volume resistance [Ω·cm] | Electromagnetic wave absorption performance [dB] | |
|---|---|---|---|---|---|---|
| | | | | | 10 GHz*1 | 5 GHz*1 |
| Comparative Example 7 | CB | Surface | 0.3 | $1.0 \times 10^2$ | 1 | 2 |
| Comparative Example 8 | CNT | Surface | 0.3 | 100 | 15 | 8 |
| Example 6 | Powder carbon material 1 | Entirety | 1 | $1.0 \times 10^5$ | 19 | 9 |
| Comparative Example 9 | Powder carbon material 3 | Entirety | 1 | $1.0 \times 10^2$ | 5 | 5 |
| Comparative Example 10 | CB | Entirety | 1 | 30 | 1 | 1 |
| Comparative Example 11 | CNT | Entirety | 1 | 30 | 10 | 6 |
| Example 7 | Powder carbon material 1 | Surface | 0.3 | $1.0 \times 10^3$ | 20 | 10 |
| Comparative Example 12 | CB | Surface | 0.3 | $1.0 \times 10^2$ | 5 | 5 |

*1Near field measurement system
*2: Far field measurement system
*3"Surface" represents a case where the carbon material is localized on the surface of the electromagnetic interference suppressing material, and "Entirety" represents a case where the carbon material is present inside the electromagnetic interference suppressing material and on the surface thereof (entirety of the electromagnetic interference suppressing material).

As presented in Table 2, the electromagnetic interference suppressing materials of Examples 1 to 3 have good radio wave absorption performance. In addition, because of their high volume resistance, their electromagnetic interference suppression performance in the near field can also be said to be good.

Further, as presented in Table 3, the electromagnetic interference suppressing materials of Examples 4 to 7 have good radio wave absorption performance.

The invention claimed is:

1. An electromagnetic interference suppressing material, comprising: a base material comprising at least one selected from the group consisting of an organic substance and an inorganic substance; and a powder carbon material, wherein
the powder carbon material comprises at least one selected from the group consisting of a first shell-shaped body and a second shell-shaped body, the first shell-shaped body being a hollow particle comprising one pore, and the second shell-shaped body having a shape in which hollow particles are connected and comprising a plurality of pores, and
a shell portion of the first shell-shaped body and the second shell-shaped body comprises graphene having an average number of layers of 4 or less.

2. The electromagnetic interference suppressing material according to claim 1, wherein a specific surface area of the powder carbon material is 1300 m²/g or more.

3. The electromagnetic interference suppressing material according to claim 1, wherein a volume of the pore possessed by the first shell-shaped body and a volume of the pores possessed by the second shell-shaped body are 1.3 cc/g or more.

4. The electromagnetic interference suppressing material according to claims 1, wherein a volume resistance is $10^3$ Ω·cm or more.

5. The electromagnetic interference suppressing material according to any of claims 1, wherein an average particle diameter of the powder carbon material is 200 μm or less.

6. The electromagnetic interference suppressing material according to claims 1, wherein the organic substance is an epoxy resin.

7. The electromagnetic interference suppressing material according to claims 1, wherein the inorganic substance is a ceramic.

8. The electromagnetic interference suppressing material according to claims 1, wherein the organic substance or the inorganic substance is a foam.

9. The electromagnetic interference suppressing material according to any of claims 1, wherein a content of the powder carbon material is from 0.01 to 95 mass %.

10. The electromagnetic interference suppressing material according to claims 1, wherein the powder carbon material is present on a surface of a base material, the base material comprising at least one selected from the group consisting of the organic substance and the inorganic substance.

11. A semiconductor element sealing material, comprising the electromagnetic interference suppressing material according to claims 1.

* * * * *